(12) United States Patent
Lee

(10) Patent No.: US 9,898,426 B2
(45) Date of Patent: Feb. 20, 2018

(54) ELECTRONIC DEVICE

(71) Applicant: SK hynix Inc., Icheon-Si (KR)

(72) Inventor: Tae-Young Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/245,813

(22) Filed: Aug. 24, 2016

(65) Prior Publication Data

US 2017/0177514 A1 Jun. 22, 2017

(30) Foreign Application Priority Data

Dec. 21, 2015 (KR) ........................ 10-2015-0182581

(51) Int. Cl.

| | | |
|---|---|---|
| G11C 11/00 | (2006.01) |
| G06F 13/16 | (2006.01) |
| H01L 43/08 | (2006.01) |
| H01L 43/10 | (2006.01) |
| G11C 11/16 | (2006.01) |
| G06F 12/0802 | (2016.01) |

(Continued)

(52) U.S. Cl.
CPC ........ *G06F 13/1668* (2013.01); *G06F 3/0611* (2013.01); *G06F 3/0647* (2013.01); *G06F 3/0656* (2013.01); *G06F 3/0659* (2013.01); *G06F 3/0685* (2013.01); *G06F 12/0802* (2013.01); *G06F 13/4068* (2013.01); *G11C 11/161* (2013.01); *H01L 43/08* (2013.01); *H01L 43/10* (2013.01)

(58) Field of Classification Search
CPC .. G06F 13/1668; G06F 3/0611; G06F 3/0647; G06F 3/0656; G06F 3/0659; G06F 3/0685

USPC .......................................................... 365/158
See application file for complete search history.

(56) References Cited

U.S. PATENT DOCUMENTS

| | | | | |
|---|---|---|---|---|
| 8,208,295 B2 * | 6/2012 | Dieny | .................... | B82Y 25/00 365/158 |
| 8,216,703 B2 * | 7/2012 | Sun | ........................ | B82Y 10/00 360/324.11 |

(Continued)

FOREIGN PATENT DOCUMENTS

| | | |
|---|---|---|
| KR | 10-2007-0036704 A | 4/2007 |
| KR | 10-2011-0129624 A | 12/2011 |
| KR | 10-2012-0078631 A | 7/2012 |

OTHER PUBLICATIONS

Lee, Tae Young et al., Formation of a bcc (001)-textured CoFe layer by the insertion of an FeZr layer in multilayer-based stacks with perpendicular magnetic anisotropy, Appl. Phy. Express, 7, 063002 (2014).

(Continued)

*Primary Examiner* — Pho M Luu
(74) *Attorney, Agent, or Firm* — Perkins Coie LLP

(57) ABSTRACT

An electronic device may include a semiconductor memory, and the semiconductor memory may include a free layer having a variable magnetization direction; a pinned layer having a pinned magnetization direction; and a tunnel barrier layer interposed between the pinned layer and the free layer, wherein the free layer may include a first magnetic layer; a second magnetic layer formed over the first magnetic layer; and a Zirconium (Zr)-containing material layer interposed between the first magnetic layer and the second magnetic layer.

24 Claims, 9 Drawing Sheets

(51) Int. Cl.
   *G06F 3/06*     (2006.01)
   *G06F 13/40*    (2006.01)

(56) References Cited

U.S. PATENT DOCUMENTS

| | | | |
|---|---|---|---|
| 8,686,484 B2* | 4/2014 | Whig | H01L 43/08 257/295 |
| 2015/0129946 A1* | 5/2015 | Annunziata | H01L 43/08 257/295 |
| 2016/0225981 A1* | 8/2016 | Deshpande | H01L 43/08 |

OTHER PUBLICATIONS

Bandiera, S. et al., Enhancement of perpendicular magnetic anisotropy thanks to Pt insertions in synthetic antiferromagnets, Appl. Phys. Lett. 101, 072410 (2012).

* cited by examiner

ELECTRONIC DEVICE

CROSS-REFERENCE TO RELATED APPLICATION

This patent document claims priority of Korean Patent Application No. 10-2015-0182581, entitled "ELECTRONIC DEVICE" and filed on Dec. 21, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory, and the semiconductor memory may include a free layer having a variable magnetization direction; a pinned layer having a pinned magnetization direction; and a tunnel barrier layer interposed between the pinned layer and the free layer, wherein the free layer may include a first magnetic layer; a second magnetic layer formed over the first magnetic layer; and a Zirconium (Zr)-containing material layer interposed between the first magnetic layer and the second magnetic layer.

Implementations of the above electronic device may include one or more the following.

The Zr-containing material layer may include an alloy including FeZr. The free layer may further include a spacer layer interposed between the first magnetic layer and the Zr-containing material layer. The spacer layer may include one or more selected from a metal, a metal nitride and/or a metal oxide. The spacer layer may include one or more selected from Chromium (Cr), Ruthenium (Ru), Iridium (Ir) and/or Rhodium (Rh). The second magnetic layer may have a thickness larger than that of the first magnetic layer. The Zr-containing material layer may include an alloy including FeZr, and the spacer layer includes Ru. The first magnetic layer and the second magnetic layer may include different materials from each other.

The electronic device may further include a material layer for relaxing a difference in lattice structures and a lattice mismatch between the first magnetic layer and the second magnetic layer, which is interposed between the first magnetic layer and the second magnetic layer. The free layer may have an SAF (synthetic antiferromagnet) structure.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include a semiconductor memory, and the semiconductor memory may include a free layer having a variable magnetization direction; a pinned layer having a pinned magnetization direction; and a tunnel barrier layer interposed between the pinned layer and the free layer, wherein the free layer may include a plurality of magnetic layers; and a Zirconium (Zr)-containing material layer interposed among the plurality of magnetic layers, wherein the free layer may have an SAF (synthetic antiferromagnet) structure.

Implementations of the above electronic device may include one or more the following.

The Zirconium (Zr)-containing material layer may include FeZr. The free layer may further include a spacer layer interposed between a magnetic layer which does not come in contact with the tunnel barrier layer among the plurality of magnetic layers and the Zr-containing material layer. The spacer layer may include one or more of a metal, metal nitride and metal oxide. The spacer layer may include one or more of Chromium (Cr), Ruthenium (Ru), Iridium (Ir) and Rhodium (Rh). A magnetic layer which comes in contact with the tunnel barrier layer among the plurality of magnetic layers may have a thickness larger than that of any one of the remaining plurality of magnetic layers. The Zr-containing material layer may include an alloy including FeZr, and the spacer layer includes Ru. The plurality of magnetic layers may include different materials from one another.

The electronic device may further include a material layer for relaxing a difference in lattice structures and a lattice mismatch among the plurality of magnetic layers, which is interposed among the plurality of magnetic layers.

In still another aspect, an electronic device may include a semiconductor memory, and the semiconductor memory may include a substrate; a plurality of memory cells formed over the substrate, each memory cell including a free layer having a variable magnetization direction that is perpendicular to the free layer and the substrate and can be in different magnetization directions to represent different data bits for data storage, wherein the free layer includes a first magnetic layer; a second magnetic layer formed over the first magnetic layer; and a Zirconium (Zr)-containing material layer interposed between the first magnetic layer and the second magnetic layer; and switching elements formed over the substrate and coupled to the memory cells to select or de-select the memory cells.

Implementations of the above electronic device may include one or more the following.

Each memory cell may include a magnetic tunnel structure that includes a magnetic tunnel junction structure that includes the free layer. The Zirconium (Zr)-containing material layer may include FeZr. The free layer may further include a spacer layer interposed between the first magnetic layer and the Zr-containing material layer. The spacer layer may include one or more selected from a metal, a metal nitride and/or a metal oxide. The spacer layer may include one or more of Chromium (Cr), Ruthenium (Ru), Iridium (Ir) and/or Rhodium (Rh). The Zr-containing material layer may include an alloy including FeZr, and the spacer layer includes Ru. In the free layer, the second magnetic layer may have a thickness larger than that of the first magnetic layer. The first magnetic layer and the second magnetic layer may include different materials from each another.

The electronic device may further include a material layer for relaxing a difference in lattice structures and a lattice mismatch between the first magnetic layer and the second magnetic layer, which is interposed between the first magnetic layer and the second magnetic layer. The free layer may have an SAF (synthetic antiferromagnet) structure.

These and other aspects, implementations and associated advantages are described in greater detail in the drawings, the description and the claims.

DETAILED DESCRIPTION

Figure 1:
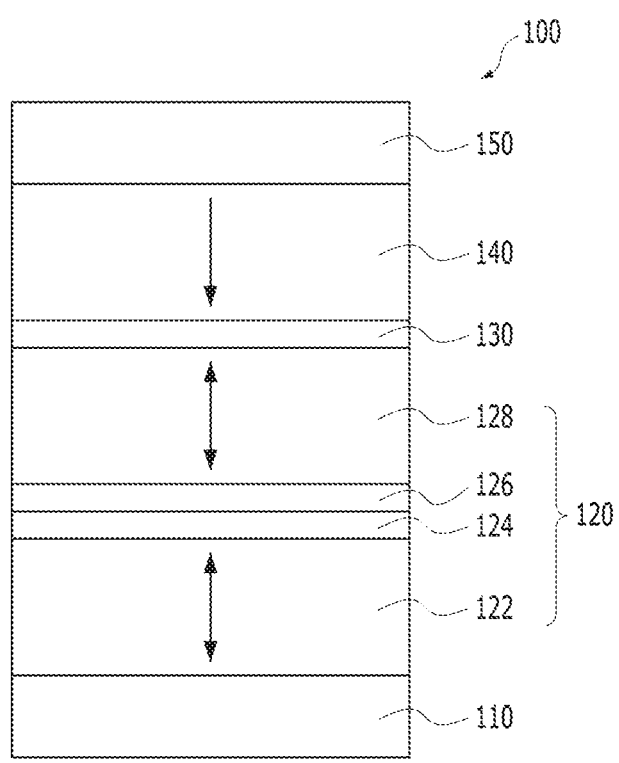
FIG. 1 is a cross-sectional view illustrating a variable resistance element in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Following implementations of the present disclosure are to provide a semiconductor memory including a variable resistance element having an improved performance and an electronic device including the same. Here, the variable resistance element may mean an element capable of being switched between different resistance states in response to the applied bias (for example, a current or voltage). Therefore, the variable resistance element having an improved performance may mean the variable resistance element having an improved switching characteristic between different resistance states.

FIG. 1 is a cross-sectional view illustrating a variable resistance element in accordance with an implementation of the present disclosure.

Referring to FIG. 1, a variable resistance element 100 in accordance with the implementation of the present disclosure may include an MTJ (magnetic tunnel junction) structure including a free layer 120 having a variable magnetization direction, a pinned layer 140 having a pinned magnetization direction, a tunnel barrier layer 130 interposed between the free layer 120 and the pinned layer 140.

The structure in FIG. 1 is configured to enable the magnetization direction of the free layer 120 to be variable and to change its direction so that the free layer 120 may practically store data according to its magnetization direction by using different magnetization directions to represent different data bits such as "0" and "1". Therefore, the free layer 120 may be referred to as a storage layer. The magnetization direction of the free layer 120 may be changed by spin transfer torque in some implementations.

The magnetization direction of the pinned layer 140 is pinned in a fixed direction and this fixed magnetization direction of the pinned layer 140 may be used as a reference direction to be compared with the magnetization direction of the free layer 120. As such, the pinned layer may be referred to as a reference layer.

The free layer 120 and the pinned layer 140 may, in some implementations, have their magnetization directions perpendicular to a surface of each layer in the MTJ structure in FIG. 1. For example, as indicated by arrows in drawings, the magnetization direction of the free layer 120 may be changed between a downward direction and an upward direction, and the magnetization direction of the pinned layer 140 may be fixed to a downward direction.

Each of the free layer 120 and the pinned layer 140 may have a single-layered structure or a multi-layered structure including a ferromagnetic material. For example, each of the free layer 120 and the pinned layer 140 may include an alloy of which a main component is Fe, Ni or Co, such as a Co—Fe—B alloy, a Co—Fe—B—X alloy (Here, X may be Al, Si, Ti, V, Cr, Ni, Ga, Ge, Zr, Nb, Mo, Pd, Ag, Hf, Ta, W or Pt.), an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. Moreover, each of the free layer 120 and the pinned layer 140 may include a stack structure of Co/Pt, Co/Pd, etc. or an alternate stack structure of a magnetic material and a non-magnetic material.

In response to a voltage or current applied to the variable resistance element 100, the magnetization direction of the free layer 120 may be changed so as to be parallel or anti-parallel to the magnetization direction of the pinned layer 140. As a result, the variable resistance element 100 may be switched between a low resistance state and a high resistance state to store different data. That is, the variable resistance element 100 may function as a memory cell.

In one implementation, the free layer 120 may include a plurality of magnetic layers and a Zirconium (Zr)-containing material layer 126 interposed between the plurality of magnetic layers. Specifically, in the illustrated example in FIG. 1, the free layer 120 may have a multi-stack structure in which a first magnetic layer 122, the Zr-containing material layer 126 and a second magnetic layer 128 are sequentially stacked.

The second magnetic layer 128 may be a magnetic layer which comes in contact with the tunnel barrier layer 130 among the plurality of magnetic layers of the free layer 120, and the first magnetic layer 122 may be referred to as any one magnetic layer which does not come in contact with the tunnel barrier layer 130 among the remaining plurality of magnetic layers.

In this case, since the total volume of the first magnetic layer 122 and the second magnetic layer 128 contributes to the thermal stability, the thermal stability may be further improved in comparison with a single-layered structure.

The first magnetic layer 122 and the second magnetic layer 128 may be formed of different materials from each other, and examples of specific materials may include the ferromagnetic material as described with reference to the free layer 120 and the pinned layer 140.

A material layer (not shown) for relaxing a difference in the lattice structures and the lattice mismatch between the first magnetic layer 122 and the second magnetic layer 128 may be interposed between the first magnetic layer 122 and the second magnetic layer 128. For example, such a material layer may be amorphous, and include a conductive material, such as a metal, metal nitride, metal oxide, and so on.

Meanwhile, in this implementation, the first magnetic layer 122 and the second magnetic layer 128 may be arranged such that their magnetization directions are anti-parallel to each other. That is, when the first magnetic layer 122 has the magnetization direction parallel to the magnetization direction of the pinned layer 140, the second magnetic layer 128 may have the magnetization direction anti-parallel to the magnetization direction of the pinned layer 140. On the contrary, when the first magnetic layer 122 has the magnetization direction anti-parallel to the magnetization direction of the pinned layer 140, the second magnetic layer 128 may have the magnetization direction parallel to the magnetization direction of the pinned layer 140. Therefore, the free layer 120 may have a SAF (synthetic antiferromagnet) structure.

The Zr-containing material layer 126 may be interposed between the first magnetic layer 122 and the second magnetic layer 128, and serve to improve a crystalline characteristic and a perpendicular magnetization characteristic of the free layer 120 and enhance the magnetoresistance (MR) and thermal stability A of an exchange coupling multi-layered thin film having an SAF structure.

The Zr-containing material layer 126 may include an alloy containing zirconium, for example, FeZr.

In accordance with this implementation, the Zr-containing material layer 126 is inserted into the free layer 120 so that MR may be enhanced due to improvement in a crystalline characteristic and a perpendicular magnetic anisotropy of the free layer 120 and thermal stability may be enhanced due to an increase in Ms (saturation magnetization) of the free layer 120.

In order to improve a perpendicular magnetic anisotropy and an exchange coupling energy, conventional technologies has been proposed to insert a Pt layer or a Pd layer in a [Pt/Co]n multi-layered thin film structure.

Figure 2:
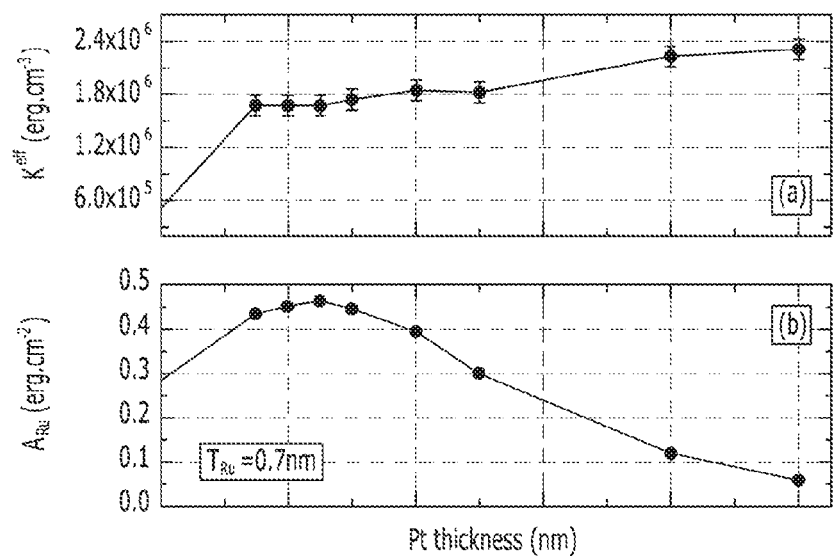
FIG. 2 is graphs illustrating a perpendicular magnetic anisotropy energy density $K^{eff}$ and an RKKY (Ruderman-Kittel-Kasuya-Yoshida) exchange coupling constant $A_{RU}$ according to a thickness of the inserted Pt layer in an exchange coupling multi-layered thin film into which a Pt layer is inserted.

FIG. 2 is graphs illustrating a perpendicular magnetic anisotropy energy density $K^{eff}$ and an RKKY (Ruderman-Kittel-Kasuya-Yoshida) exchange coupling constant $A_{RU}$ according to a thickness of the inserted Pt layer in an exchange coupling multi-layered thin film into which a Pt layer is inserted. Here, the RKKY exchange coupling constant $A_{RU}$ may be referred to as an exchange coupling energy constant.

As shown in FIG. 2, in case of inserting the Pt layer in the [Pt/Co]n multi-layered thin film structure, a perpendicular magnetic anisotropy and an exchange coupling energy may be improved. However, since a heavy metal such as Pt or Pd causes an increase in a damping constant, it has been substantially difficult to apply the heavy metal to the free layer 120 of the exchange coupling multi-layered structure.

In accordance with this implementation, by inserting the Zr-containing material layer 126 such as an FeZr layer into the free layer 120 of the exchange coupling multi-layered structure, the problems as described above with reference to the heavy metal may be overcome. Further, the perpendicular magnetic anisotropy and the exchange coupling energy may be improved so that the exchange coupling multi-layered thin film having the SAF structure with improved reliability may be provided.

Figure 3:
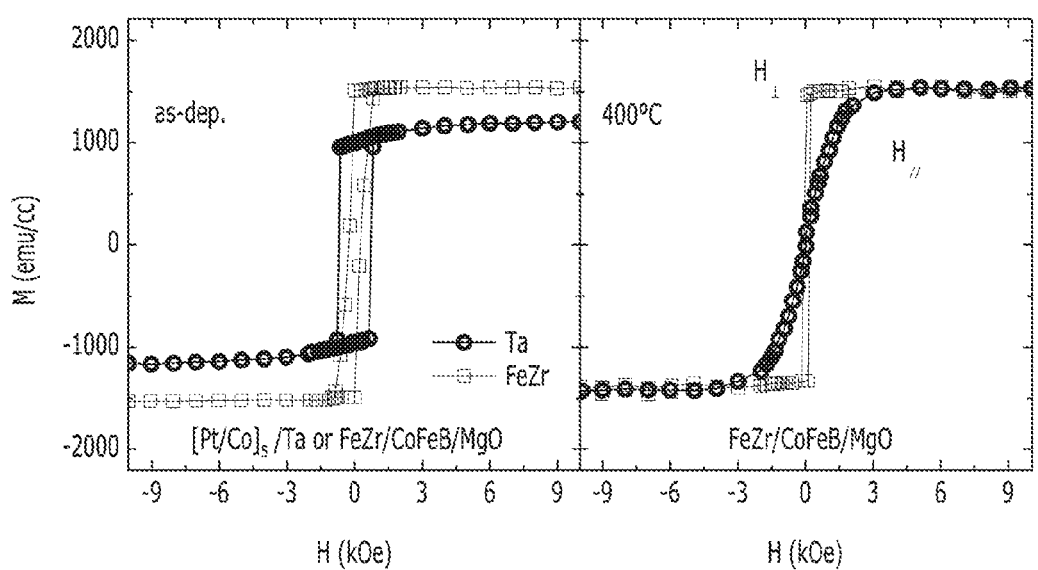
FIG. 3 shows M-H magnetization curves of an exchange coupling multi-layered thin film into which an FeZr layer is inserted, wherein a left panel shows M-H magnetization curves in a perpendicular direction of a [Pt/Co]n/Ta/CoFeB/MgO thin film and a [Pt/Co]n/FeZr/CoFeB/MgO thin film, and a right panel shows M-H magnetization curves in a perpendicular direction and a horizontal direction of an FeZr/CoFeB/MgO thin film.

FIG. 3 shows M-H magnetization curves of the exchange coupling multi-layered thin film into which an FeZr layer is inserted, wherein a left panel shows M-H magnetization curves in a perpendicular direction of a [Pt/Co]n/Ta/CoFeB/MgO thin film and a [Pt/Co]n/FeZr/CoFeB/MgO thin film, and a right panel shows M-H magnetization curves in a perpendicular direction and a horizontal direction of an FeZr/CoFeB/MgO thin film.

From the left panel of FIG. 3, it is confirmed that when the FeZr layer is inserted, high saturation magnetization Ms and a squareness ratio close to 1 are obtained and thus, a more superior perpendicular magnetic anisotropy characteristic may be exhibited, in comparison with inserting the Ta layer which is mainly used as a texture decoupling barrier.

Moreover, from the right panel of FIG. 3, it is shown that a perpendicular magnetic anisotropy field Hk in the FeZr/CoFeB/MgO structure is approximately 4 kOe and thus, a strong perpendicular magnetic anisotropy is exhibited.

In accordance with this implementation, the Zr-containing material layer 126 including the FeZr layer capable of exhibiting such a significant perpendicular magnetic anisotropy is inserted into the free layer 120 of the exchange coupling multi-layered structure so that the relatively thick free layer 120 may be applied and thus, MR and thermal stability may be improved.

Figure 4:
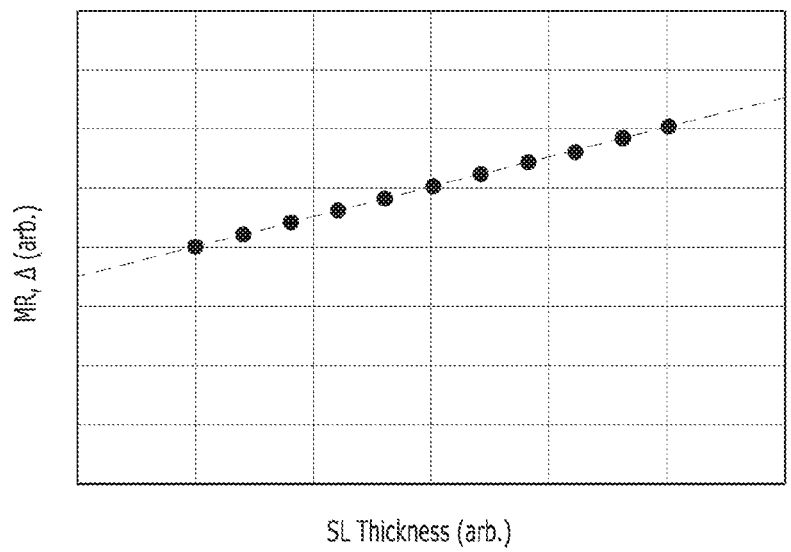
FIG. 4 are graphs illustrating MR (magnetoresistance) and thermal stability according to a thickness of a free layer.

FIG. 4 are graphs illustrating MR and thermal stability according to a thickness of a free layer.

As shown in FIG. 4, as the thickness of the free layer is increased, MR and thermal stability may be improved. However, on the contrary, in order to exhibit a perpendicular magnetic anisotropy in a perpendicular MTJ structure, the free layer is required to have a relatively small thickness, usually a thickness of about 1.4 nm or less. Therefore, since as the thickness of the free layer is increased, the perpendicular magnetic anisotropy characteristic is rapidly deteriorated, there is a limit to improving MR and thermal stability in the conventional structure.

In this implementation, the Zr-containing material layer 126 is inserted into the free layer so that a thickness of the free layer 120, in particular, the second magnetic layer 128 may be relatively increased and thus, MR and thermal stability may be improved.

Therefore, in accordance with this implementation, the second magnetic layer 128 may have a thickness larger than that of the first magnetic layer 122.

Moreover, as described below, in case that the free layer 120 further includes a spacer layer 124, the Zr-containing material layer 126 may be disposed between the spacer layer 124 and the second magnetic layer 128.

The spacer layer 124 may serve to induce an interlayer exchange coupling and be disposed between the first magnetic layer 122 and the second magnetic layer 128, and more specifically, between the first magnetic layer 122 and the Zr-containing material layer 126.

The spacer layer 124 may have a metallic non-magnetic material such as a metal, metal nitride, metal oxide, and the like. Specific examples thereof may include Cr, Ru, Ir, Rh, and the like.

By forming the spacer layer 124 between the first magnetic layer 122 and the second magnetic layer 128, it is possible to implement an AF (antiferromagnetic) coupling or an F (ferromagnetic) coupling according to a thickness of the spacer layer 124 through an RKKY exchange coupling. As described above, in this implementation, the free layer 120 may have an SAF structure capable of implementing an AF coupling between the first magnetic layer 122 and the second magnetic layer 128.

Meanwhile, in order to improve MR in the exchange coupling multi-layered structure, it is required to crystallize the second magnetic layer 128 which substantially contributes to MR in a bcc structure with (001) texture. However, in case that the free layer 120 includes the spacer layer 124 containing Ru and the like, the second magnetic layer 128 is crystallized in a bcc structure with (110) texture due to a crystalline characteristic of the spacer layer 124 including Ru and the like having an hcp structure with (0001) texture. As a result, since it is difficult to crystallize the second magnetic layer 128 in a bcc structure with (001) texture, there may be a limit to securing a sufficient exchange coupling energy, and thus to increasing a thickness of the free layer.

However, in such a case, in accordance with this implementation, the Zr-containing material layer 126 including FeZr and the like is inserted into the free layer 120 so that crystallization of the second magnetic layer 128 in a bcc structure with (110) texture due to a crystalline characteristic of the spacer layer 124 in an hcp structure with (0001)

texture may be prevented to facilitate crystallization in a bcc structure with (001) texture. Accordingly, it is possible to exhibit superior improvement of MR and thermal stability.

Figure 5:
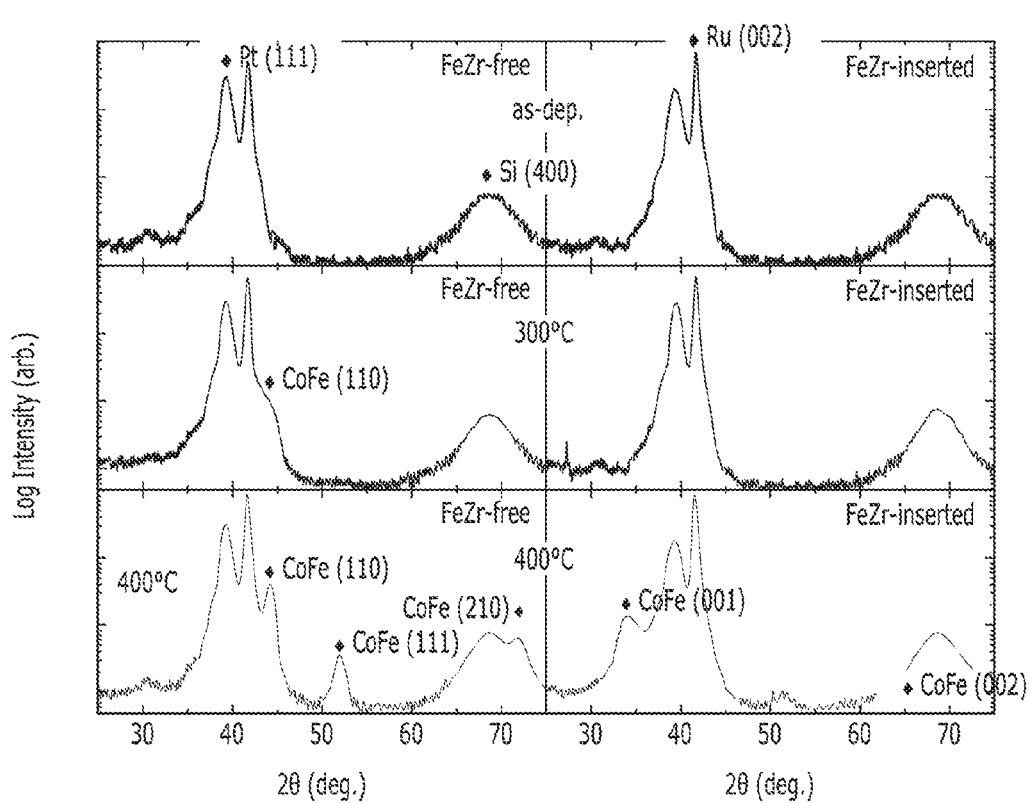
FIG. 5 are graphs illustrating XRD patterns showing a crystalline characteristic of a CoFeB layer in an exchange coupling multi-layered thin film according to a heat-treatment temperature, wherein a left panel is for a [Pt/Co]n/CoFeB/MgO thin film and a right panel is for [Pt/Co]n/FeZr/CoFeB/MgO thin film.

FIG. 5 are graphs illustrating XRD patterns showing a crystalline characteristic of a CoFeB layer in the exchange coupling multi-layered thin film according to a heat-treatment temperature, wherein a left panel is for a [Pt/Co]n/CoFeB/MgO thin film and a right panel is for [Pt/Co]n/FeZr/CoFeB/MgO thin film.

From FIG. 5, in case that an FeZr layer is not inserted (left panel), since by heat-treatment, the CoFeB layer is crystallized in a bcc structure with (111) texture due to an influence of an fcc structure with (111) texture of the adjacent [Pt/Co]n layer, a significant deterioration of MR is expected (lower graph of the left panel). On the contrary, in case that an FeZr layer is inserted (right panel), since by heat-treatment, the amorphous FeZr layer prevents a crystallization effect of the [Pt/Co]n layer, the CoFeB layer may be crystallized in a bcc structure with (001) texture due to an influence of the MgO layer which is the tunnel barrier layer and thus, superior improvement of MR and thermal stability is expected (lower graph of the right panel).

In the context of such an aspect, in accordance with this implementation, it is possible to prevent the second magnetic layer 128 from crystallizing in a bcc structure with (110) texture due to an influence of a crystalline characteristic in an hcp structure with (0001) texture of the spacer layer 124 and facilitate crystallization of the second magnetic layer 128 in a bcc structure with (001) texture. As a result, MR and thermal stability may be remarkably improved.

The tunnel barrier layer 130 may serve to change the magnetization direction of the free layer 120 by tunneling of electrons. The tunnel barrier layer 130 may include an insulating oxide, for example, MgO, CaO, SrO, TiO, VO, NbO, etc.

Further, the variable resistance element 100 in accordance with this implementation may further include one or more additional layers performing various functions to improve a characteristic of the MTJ structure. Specifically, the variable resistance element 100 may include an under layer 110 disposed under the MTJ structure, an upper layer 150 disposed over the MTJ structure, and the like.

The under layer 110 may be used to improve a characteristic, specifically a perpendicular magnetic anisotropy or a crystalline characteristic of the layer disposed over the under layer 110, for example, the free layer 120. The under layer 110 may have a single-layered structure or a multi-layered structure including a conductive material such as a metal, metal nitride, etc.

The upper layer 150 may be referred to as a capping layer and function as a hard mask for patterning the variable resistance element 100. The upper layer 150 may include various conductive materials such as a metal, etc.

In addition, although they are not shown, the variable resistance element 100 may include a buffer layer, an exchange coupling layer, a magnetic correction layer, etc. as the functional layer.

The buffer layer may be disposed on a lower electrode (not shown) and include a metal, an alloy, or oxide. The buffer layer may be formed of a material having a superior matching for the lower electrode in order to overcome inconsistency of the lattice constants between the lower electrode and the under layer. For example, when the under layer is formed of TiN, the buffer layer may be formed of Ta having a superior matching for TiN.

The magnetic correction layer may be used to offset or reduce an influence of a stray field generated by the pinned layer 140. In this case, the influence of the stray filed of the pinned layer 140 on the free layer 120 is decreased so that a bias magnetic field in the free layer 120 may be reduced. As a result, thermal stability and a magnetic characteristic of the pinned layer 140 may be improved. The magnetic correction layer may have a magnetization direction opposite to that of the pinned layer 140. Alternatively, independently of the variable resistance element 100, such a magnetic correction layer may be further formed in a region adjacent to the variable resistance element 100.

The exchange coupling layer may be interposed between the magnetic correction layer and the pinned layer and used to provide an interlayer exchange coupling therebetween. The exchange coupling layer may include a metallic non-magnetic material such as Cr, Ru, Ir, Rh, etc.

On the other hand, in the variable resistance element 100 in accordance with this implementation, the free layer 120 is formed under the pinned layer 140, while the implementation may be also applied in case that the free layer 120 is formed over the pinned layer 140. In such a case, for example, the variable resistance element 100 may have a multi-stack structure in which the under layer, the pinned layer, the tunnel barrier layer, the second magnetic layer, the Zr-containing material layer, the spacer layer, the first magnetic layer and the upper layer are sequentially stacked.

In accordance with the variable resistance element 100 of this implementation, it is possible to obtain advantages as follows.

First, since the free layer 120 includes the first and second magnetic layers 122 and 128 and the variable resistance element 100 uses an exchange coupling between the first and second magnetic layers 122 and 128, a total volume of the first and second magnetic layers 122 and 128 may contribute to thermal stability and a thickness of the second magnetic layer 128 may be increased, thereby improving MR and thermal stability.

Moreover, since the Zr-containing material layer 126 is interposed between the first and second magnetic layers 122 and 128, a thickness of the free layer 120, in particular, the second magnetic layer 128 may be increased while a crystalline characteristic and a perpendicular magnetic anisotropy may be improved at the same time.

Therefore, since a perpendicular magnetization characteristic of the free layer 120 is improved, MR and thermal stability may be further improved and an exchange coupling energy may be increased so that an exchange coupling multi-layered thin film having an SAF structure with a high reliability may be provided.

Further, since by increasing stability of an SAF structure of the free layer, an influence of a stray magnetic field generated by the pinned layer may be reduced and a stable magnetization state may be maintained on a vulnerable edge portion, MR and thermal stability may be further improved.

Meanwhile, the free layer 120 including the Zr-containing material layer 126 may be fabricated by various processes and this will be exemplarily described with reference to FIG. 1.

Referring to FIG. 1, the first magnetic layer 122 may be formed over the under layer 110. The first magnetic layer 122 may be formed by depositing a ferromagnetic material described above.

Next, the spacer layer 124 may be formed over the first magnetic layer 122. The spacer layer 124 may be formed by depositing a metallic non-magnetic material including a metal, metal nitride, metal oxide, for example, Cr, Ru, Ir, Rh, etc.

Then, the Zr-containing material layer 126 may be formed over the spacer layer 124. In case of forming an FeZr layer as the Zr-containing material layer 126, the FeZr layer may be formed through a physical deposition process by using an alloy target, for example, a sputtering process.

In another implementation, after an Fe layer is deposited and a Zr layer is deposited over the Fe layer, an FeZr layer may be formed by a reaction between the Fe layer and the Zr layer through a heat treatment. Here, a sequence of stacking the Fe layer and the Zr layer may be reversed.

In further another implementation, after a plurality of Fe layers and a plurality of Zr layers are alternately deposited, the FeZr layer may be formed through a heat treatment.

In still another implementation, the FeZr layer may be formed through a physical deposition process by using an Fe target and a Zr target, for example, a co-sputtering process.

Then, the second magnetic layer 128 may be formed over the Zr-containing material layer 126. The second magnetic layer 128 may be formed by depositing a ferromagnetic material described above like the first magnetic layer 122.

The variable resistance element 100 including the free layer 120 may be provided in plural to constitute a cell array. The cell array may include various components such as lines, elements, etc. to drive the variable resistance element 100.

Figure 6A:
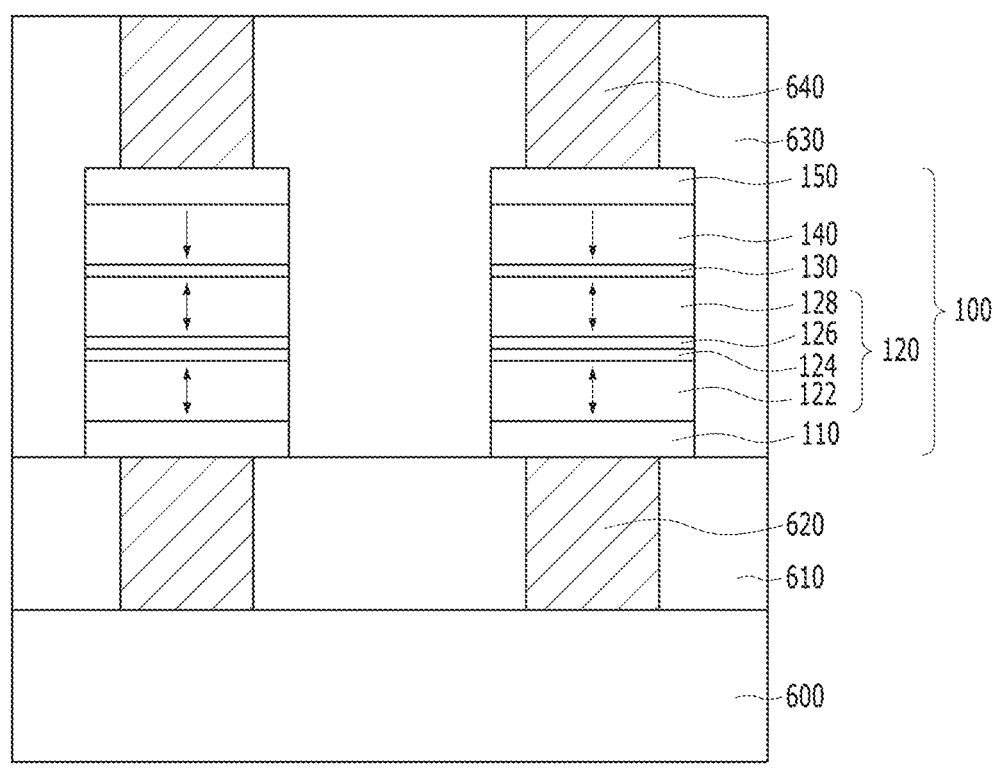
FIG. 6A is a cross-sectional view for explaining a memory device and an example of a method for fabricating the same in accordance with an implementation of the present disclosure.

FIG. 6A is a cross-sectional view for explaining a memory device and an example of a method for fabricating the same in accordance with an implementation of the present disclosure.

Referring to FIG. 6A, the memory device of this implementation may include a substrate 600, a lower contact 620, a variable resistance element 100 and an upper contact 640. The substrate 600 may include a specific structure (now shown) as a switch or switching circuit, for example, a transistor, for controlling an access to the variable resistance element 100 where the switch can be turned on to select the variable resistance element 100 or turned off to de-select the variable resistance element 100. The lower contact 620 may be disposed over the substrate 600, and couple a lower end of the variable resistance element 100 with a portion of the substrate 600, for example, a drain of the transistor as the switching circuit for the variable resistance element 100. The upper contact 640 may be disposed over the variable resistance element 100, and couple an upper end of the variable resistance element 100 with a certain line (not shown), for example, a bit line. As illustrated in FIG. 6A, two variable resistance elements 100 are shown as two examples of the elements in an array of such variable resistance elements 100. The above memory device may be fabricated by following processes.

First, the substrate 600 in which the transistor is formed may be provided, and then, a first interlayer dielectric layer 610 may be formed over the substrate 300. Then, the lower contact 620 may be formed by selectively etching the first interlayer dielectric layer 610 to form a hole exposing a portion of the substrate 600 and filling the hole with a conductive material. Then, the variable resistance element 100 may be formed by forming material layers for the variable resistance element 100 over the first interlayer dielectric layer 610 and the lower contact 620, and selectively etching the material layers. The etching process for forming the variable resistance element 100 may include the IBE method which has a strong physical etching characteristic. Then, a second interlayer dielectric layer 630 may be formed to cover the variable resistance element. Then, the second interlayer dielectric layer 630 may be selectively etched to form a hole which exposes the top of the variable resistance element 100, and a conductive material may be buried in the hole so as to form the upper contact 640.

In the memory device in accordance with this implementation, all layers forming the variable resistance element 100 may have sidewalls which are aligned with each other. That is because the variable resistance element 100 is formed through an etching process using one mask.

Unlike the implementation of FIG. 6A, a part of the variable resistance element 100 may be patterned separately from the other parts. This process is illustrated in FIG. 6B.

Figure 6B:
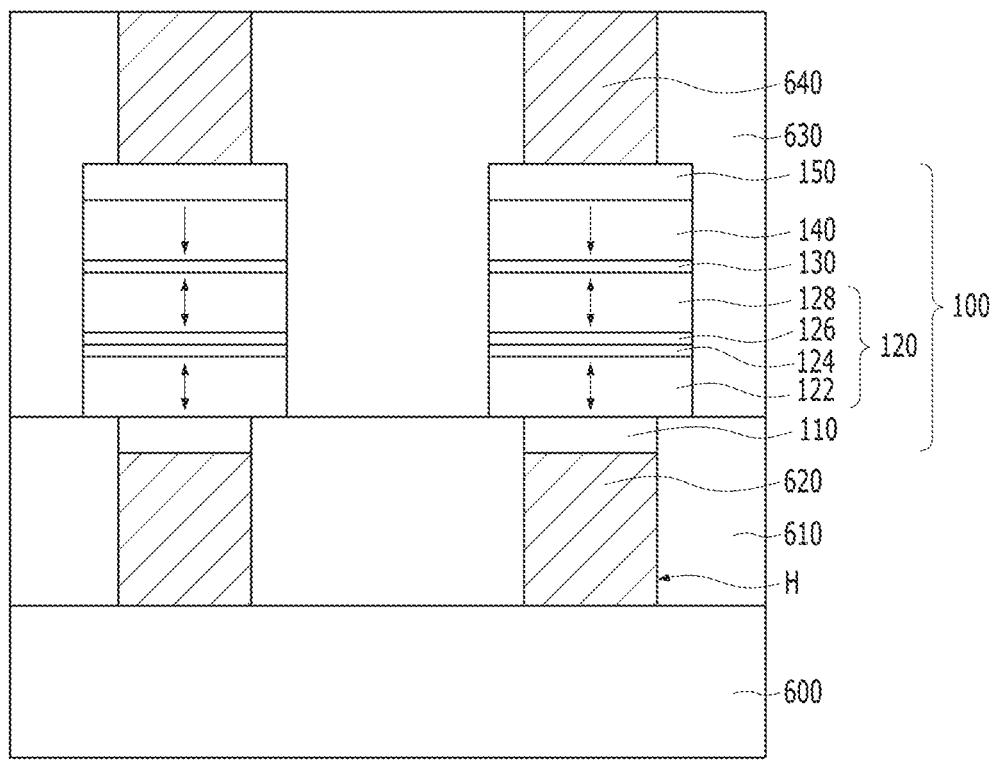
FIG. 6B is a cross-sectional view for explaining a memory device and a method for fabricating the same in accordance with an implementation of the present disclosure.

FIG. 6B is a cross-sectional view for explaining a memory device having variable resistance elements and a method for fabricating the same in accordance with an implementation of the present disclosure. The following descriptions will be focused on a difference from the implementation of FIG. 6A.

Referring to FIG. 6B, the memory device in accordance with this implementation may include a variable resistance element 100 of which parts, for example, the under layer 110 has sidewalls that are not aligned with the other layers thereof. The under layer 110 may have sidewalls which are aligned with a lower contact 620.

The memory device may be fabricated by following processes.

First, a first interlayer dielectric layer 610 may be formed over a substrate 600, and then selectively etched to form a hole H which expose a part of the substrate 600. Then, a lower contact 620 may be formed to fill the lower part of the hole H. More specifically, the lower contact 620 may be formed through a series of processes of forming a conductive material to cover the resultant structure having the hole H formed therein, and removing a part of the conductive material through an etch back process or the like until the conductive material has a desired thickness. Then, the under layer 110 may be formed to fill the other part of the hole H having the lower contact 620 formed therein. More specifically, the under layer 110 may be formed through a series of processes of forming a material layer including a light metal, etc. for the under layer 110 to cover the resultant structure in which the lower contact 620 is formed, and performing a planarization process, for example, CMP (Chemical Mechanical Process) until the top surface of the first interlayer dielectric layer 610 is exposed. Then, material layers for forming the other layers of the variable resistance element 100 excluding the under layer 110 may be formed over the lower contact 620 and the first interlayer dielectric layer 610, and then selectively etched to form the other layers of the variable resistance element 100. The subsequent processes may be performed in substantially the same manner as described with reference to FIG. 6A.

In this implementation, the height which needs to be etched at a time in order to form the variable resistance element 100 may be reduced, which makes it possible to lower the difficulty level of the etching process.

Moreover, although in this implementation, the case that the under layer 110 is buried in the hole H is described, other parts such as the first magnetic layer 122, the first magnetic layer and the spacer layer 124, or the free layer 120, etc. may be further buried as needed.

In accordance with implementation, it is possible to improve characteristics of the variable resistance element and thus, improve characteristics of the semiconductor memory including the variable resistance element and the electronic device including the semiconductor device.

The above and other memory circuits or semiconductor devices based on the disclosed technology can be used in a range of devices or systems. FIGS. 7-11 provide some examples of devices or systems that can implement the memory circuits disclosed herein.

Figure 7:
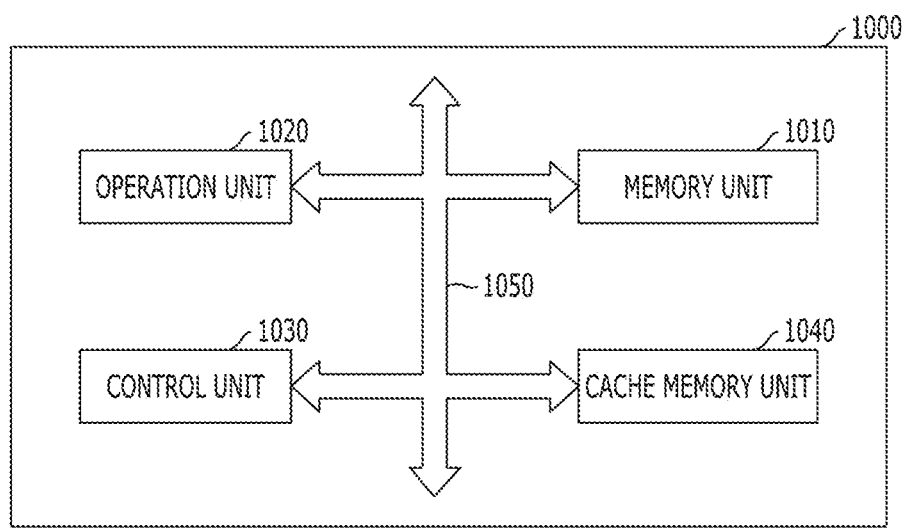
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
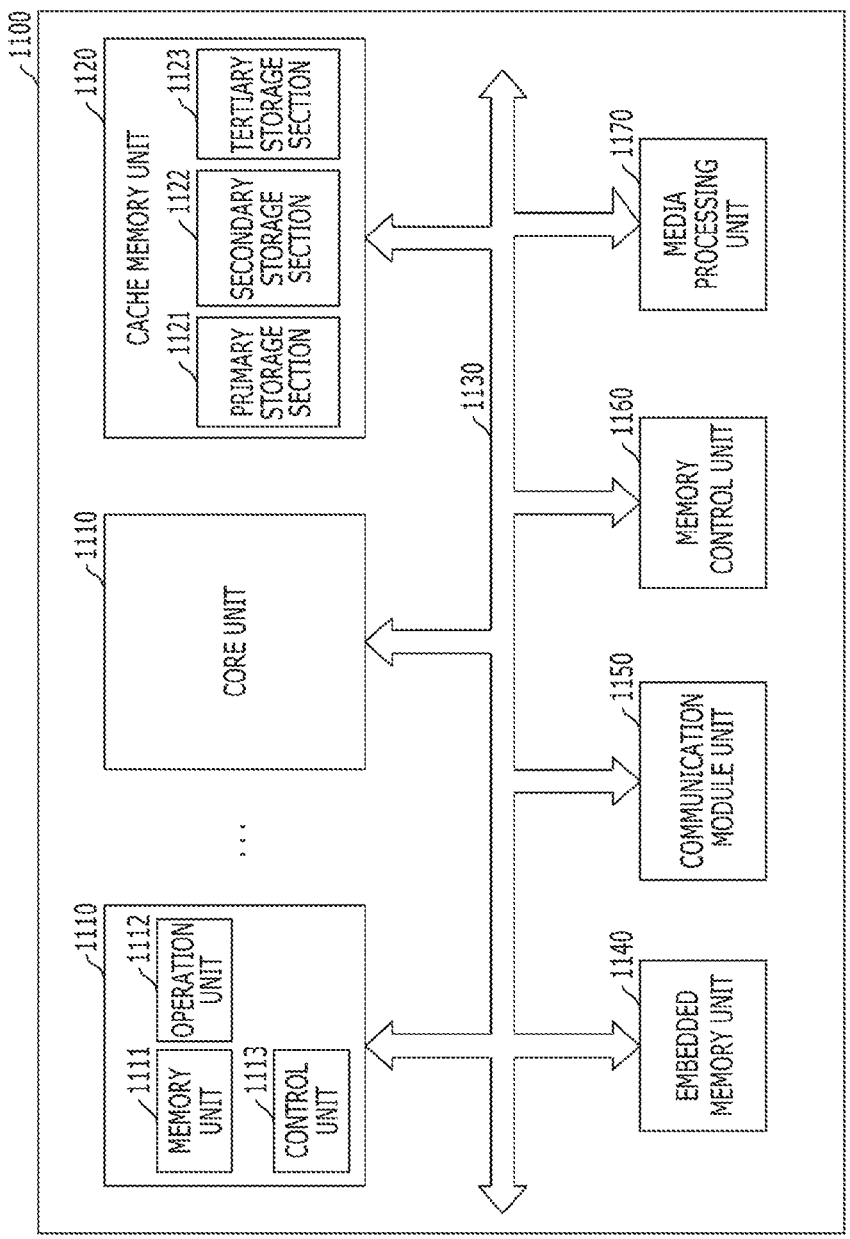
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
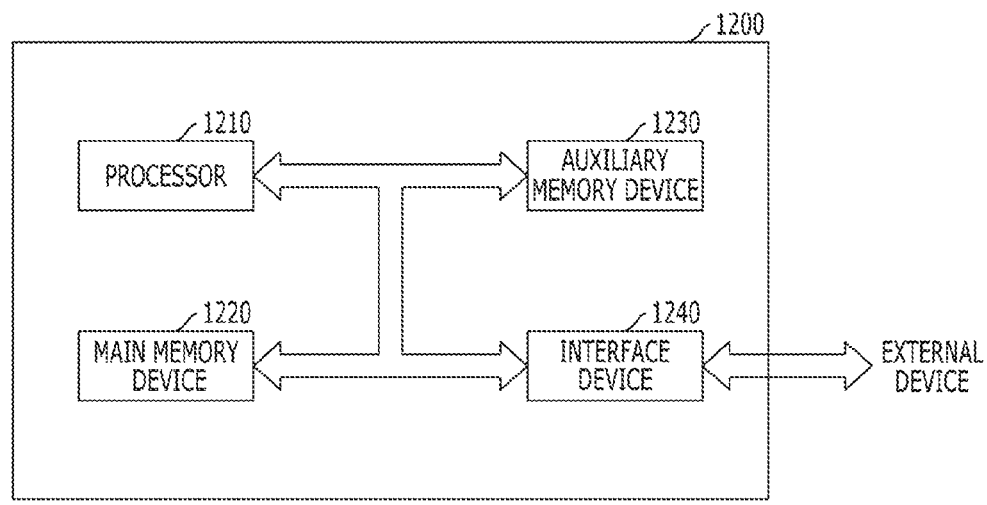
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
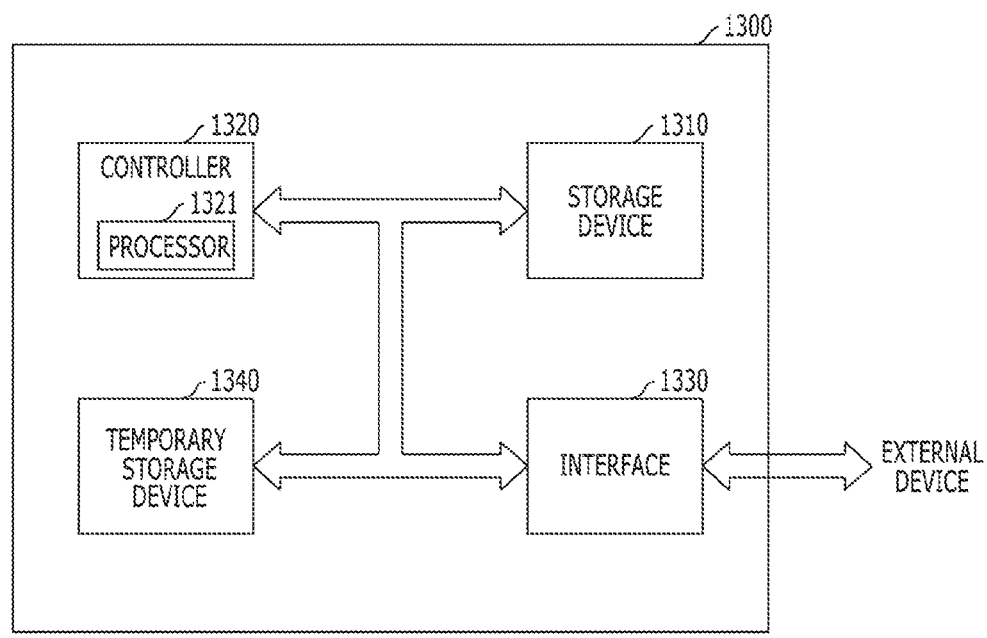
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the storage device 1310 or the temporary storage device 1340 may be improved. As a consequence, operating characteristics and data storage characteristics of the data storage system 1300 may be improved.

Figure 11:
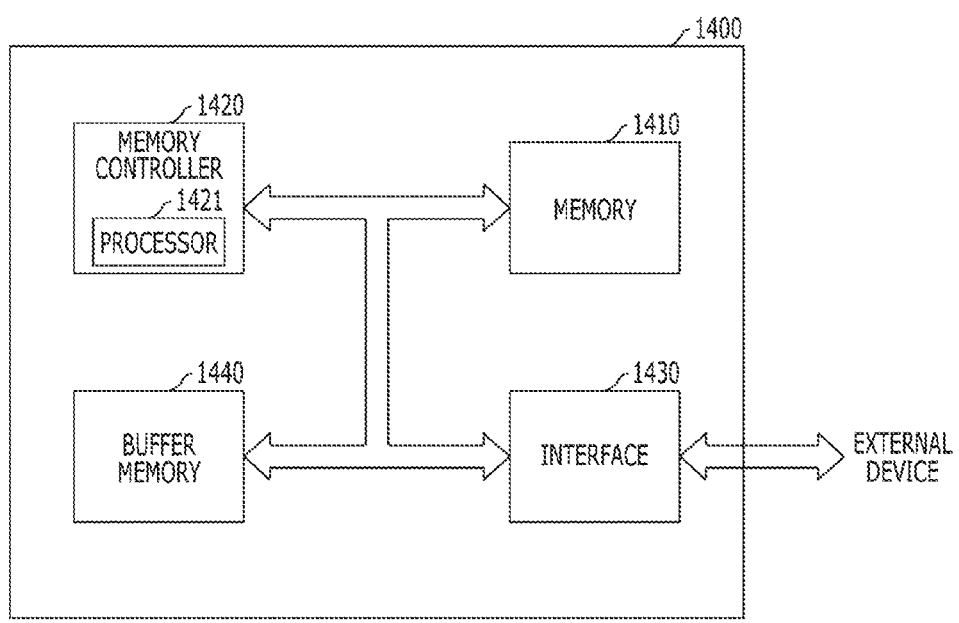
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a free layer having a variable magnetization direction; a pinned layer having a pinned magnetization direction; and a tunnel barrier layer interposed between the pinned layer and the free layer, and the free layer may include a first magnetic layer; a second magnetic layer formed over the first magnetic layer; and a Zirconium (Zr)-containing material layer interposed between the first magnetic layer and the second magnetic layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
    a free layer having a variable magnetization direction;
    a pinned layer having a pinned magnetization direction; and
    a tunnel barrier layer interposed between the pinned layer and the free layer,
    wherein the free layer includes:
    a first magnetic layer;
    a second magnetic layer formed over the first magnetic layer; and
    a Zirconium (Zr)-containing material layer interposed between the first magnetic layer and the second magnetic layer,
    wherein the Zr-containing material layer includes an alloy including FeZr.

2. The electronic device of claim 1, wherein the free layer further includes a spacer layer interposed between the first magnetic layer and the Zr-containing material layer.

3. The electronic device of claim 2, wherein the spacer layer includes one or more of a metal, a metal nitride or a metal oxide.

4. The electronic device of claim 3, wherein the spacer layer includes one or more of Chromium (Cr), Ruthenium (Ru), Iridium (Ir) or Rhodium (Rh).

5. The electronic device of claim 2, wherein the Zr-containing material layer includes an alloy including FeZr, and the spacer layer includes Ru.

6. The electronic device of claim 1, wherein the second magnetic layer has a thickness larger than that of the first magnetic layer.

7. The electronic device of claim 1, wherein the first magnetic layer and the second magnetic layer include different materials from each other.

8. The electronic device of claim 7, further comprising a material layer for relaxing a difference in lattice structures and a lattice mismatch between the first magnetic layer and the second magnetic layer, which is interposed between the first magnetic layer and the second magnetic layer.

9. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

10. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

11. An electronic device comprising a semiconductor memory, wherein the semiconductor memory includes:
    a free layer having a variable magnetization direction;
    a pinned layer having a pinned magnetization direction; and
    a tunnel barrier layer interposed between the pinned layer and the free layer,
    wherein the free layer includes:
    a plurality of magnetic layers; and
    a Zirconium (Zr)-containing material layer interposed among the plurality of magnetic layers,
    wherein the free layer has an SAF (synthetic antiferromagnet) structure, and
    wherein the Zr-containing material layer includes FeZr.

12. The electronic device of claim 11, wherein the free layer further includes a spacer layer interposed between a magnetic layer which does not come in contact with the tunnel barrier layer among the plurality of magnetic layers and the Zr-containing material layer.

13. The electronic device of claim 12, wherein the spacer layer includes one or more of a metal, a metal nitride or a metal oxide.

14. The electronic device of claim 13, wherein the spacer layer includes one or more of Chromium (Cr), Ruthenium (Ru), Iridium (Ir) or Rhodium (Rh).

15. The electronic device of claim 12, wherein the Zr-containing material layer includes an alloy including FeZr, and the spacer layer includes Ru.

16. The electronic device of claim 11, wherein a magnetic layer which comes in contact with the tunnel barrier layer among the plurality of magnetic layers has a thickness larger than that of any one of the remaining plurality of magnetic layers.

17. The electronic device of claim 11, wherein the plurality of magnetic layers include different materials from one another.

18. The electronic device of claim 17, further comprising a material layer for relaxing a difference in lattice structures and a lattice mismatch among the plurality of magnetic layers, which is interposed among the plurality of magnetic layers.

19. An electronic device comprising a semiconductor memory, wherein the semiconductor memory includes:
a free layer having a variable magnetization direction;
a pinned layer having a pinned magnetization direction; and
a tunnel barrier layer interposed between the pinned layer and the free layer,
wherein the free layer includes:
a first magnetic layer;
a second magnetic layer formed over the first magnetic layer; and
a Zirconium (Zr)-containing material layer interposed between the first magnetic layer and the second magnetic layer,
wherein the first magnetic layer and the second magnetic layer include different materials from each other, and
wherein the electronic device further comprises a material layer for relaxing a difference in lattice structures and a lattice mismatch between the first magnetic layer and the second magnetic layer, which is interposed between the first magnetic layer and the second magnetic layer.

20. The electronic device of claim 19, wherein the Zr-containing material layer includes FeZr.

21. The electronic device of claim 19, wherein second magnetic layer has a thickness greater than that of the first magnetic layer.

22. An electronic device comprising a semiconductor memory, wherein the semiconductor memory includes:
a free layer having a variable magnetization direction;
a pinned layer having a pinned magnetization direction; and
a tunnel barrier layer interposed between the pinned layer and the free layer,
wherein the free layer includes:
a plurality of magnetic layers; and
a Zirconium (Zr)-containing material layer interposed among the plurality of magnetic layers,
wherein the free layer has an SAF (synthetic antiferromagnet) structure,
wherein the plurality of magnetic layers include different materials from one another, and
wherein the electronic device further comprises a material layer for relaxing a difference in lattice structures and a lattice mismatch among the plurality of magnetic layers, which is interposed among the plurality of magnetic layers.

23. The electronic device of claim 22, wherein the Zr-containing material layer includes FeZr.

24. The electronic device of claim 22, wherein second magnetic layer has a thickness greater than that of the first magnetic layer.

* * * * *